United States Patent
Lin et al.

(10) Patent No.: US 9,439,290 B1
(45) Date of Patent: Sep. 6, 2016

(54) CARRIER BOARD STRUCTURE

(71) Applicant: KINSUS INTERCONNECT TECHNOLOGY CORP., Taoyuan (TW)

(72) Inventors: Ting-Hao Lin, Taipei (TW); Chiao-Cheng Chang, Taoyuan (TW); Yi-Nong Lin, Keelung (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 14/817,268

(22) Filed: Aug. 4, 2015

(51) Int. Cl.
*H01F 27/30* (2006.01)
*H01F 5/00* (2006.01)
*H01F 27/29* (2006.01)
*H05K 1/18* (2006.01)
*H05K 1/02* (2006.01)
*H01F 27/28* (2006.01)

(52) U.S. Cl.
CPC .............. *H05K 1/189* (2013.01); *H01F 27/28* (2013.01); *H05K 1/028* (2013.01); *H05K 2201/1003* (2013.01)

(58) Field of Classification Search
CPC .... H01F 27/28; H01F 27/2804; H01F 27/29; H01F 27/292; H01F 17/006; H05K 1/18; H05K 1/02

USPC ........ 336/199, 200, 232, 205, 192; 361/720, 361/748, 749, 750, 760
See application file for complete search history.

(56) References Cited

U.S. PATENT DOCUMENTS

| | | | |
|---|---|---|---|
| 2004/0178875 A1* | 9/2004 | Saito | G01R 15/181 336/200 |
| 2013/0293337 A1* | 11/2013 | Lo | H01F 5/003 336/200 |
| 2014/0139310 A1* | 5/2014 | Asano | H05K 3/20 336/200 |

* cited by examiner

*Primary Examiner* — Mangtin Lian
(74) *Attorney, Agent, or Firm* — Lin & Associates Intellectual Property, Inc.

(57) ABSTRACT

A carrier board structure includes at least one upper magnetic coil, at least one lower magnetic coil, a flexible board, a dielectric layer, at least one connection pad and at least one gold finger. The flexible board has a middle region having a middle hole, and two side regions thinner than the middle region. A groove used as a fold line is provided on the lower surface of each side region bordering on the middle region. The upper and lower magnetic coils are configured in the flexible board and separated by the dielectric layer. The gold fingers are provided on the two side regions and connected to the upper magnetic coils. The upper and lower magnetic coils are around the middle hole and connected by the connection pads. The fold lines help the two side regions to fold without damage to the upper and lower magnetic coils.

4 Claims, 2 Drawing Sheets

CARRIER BOARD STRUCTURE

BACKGROUND OF THE INVENTION

1. Field of the Invention

The present invention generally relates to a carrier board structure, and more specifically to a carrier board structure having at least one magnetic coil and a flexible board provided in a carrier board so as to avoid the process of attaching the magnetic coil to the flexible board and increase preciseness of alignment as a hole being drilled through the coil and the flexible board.

2. The Prior Arts

In general, electrical appliances need rigid circuit boards to install and connect various electrical or electronic elements. One of the most commonly used material for the rigid circuit board is epoxy substrate because of excellent electrical insulation. While such a rigid circuit board exhibits good mechanical strength, it is difficult to use in the actual application with limited area like mobile phones because it can not easily fold without damage. Thus, the manufacturers successfully developed flexible circuit boards to meet the demand of the market. Recently, the technology of the flexible circuit boards has been well developed and advanced.

In addition, the electrical circuit sometimes needs coils to perform inductor function such as magnetic induction coils. The traditional skill usually employs metal copper or copper alloy to form the coil with a spiral pattern by means of etching or electroplating, and particularly, it still needs chemical etching, mechanical drilling or laser drilling to form through holes.

Since the current coils and flexible boards are manufactured by different manufacturers, and the coils and the flexible boards are respectively provided with the through holes, it needs to attach the coils and the flexible boards to form the carrier board as desired. Additional processes are thus needed and the problem of less preciseness for alignment of respective holes of the coils and the flexible boards often occurs. As a result, the whole electrical performance of the carrier board is adversely affected due to misalignment or skew.

Therefore, it is greatly needed to provide a new carrier board structure, which generally comprises a flexible board with a middle hole, magnetic coils embedded in the flexible board and around a middle hole, gold fingers configured on the flexible board and connected to the magnetic coils, the flexible board having two fold lines to easily fold according to actual applications, and the problem of less preciseness for alignment of respective holes in the prior arts is prevented because the magnetic coils and the flexible board are formed in the carrier board without the attaching process, thereby overcoming the above problems in the prior arts.

SUMMARY OF THE INVENTION

The primary objective of the present invention is to provide a carrier board structure which comprises at least one upper magnetic coil, at least one lower magnetic coil, a flexible board, at least one gold finger, a dielectric layer and at least one connection pad, and is foldable to provide a coil function for applications of magnetic induction.

The flexible board is a thin sheet with two side regions and one middle region, wherein the side regions are thinner than the middle region, and the middle region is bulgy downwards. The upper magnetic coils and the lower magnetic coils are embedded in the flexible board, each having a spiral shape. The upper magnetic coils are close to the upper surface of the flexible board, and the lower magnetic coils are close to the lower surface of the flexible board. The dielectric layer is embedded in the flexible board and separates the upper magnetic coils and the lower magnetic coils.

In addition, the middle region of the flexible board is provided with a middle hole, which penetrates the dielectric layer within the middle region. The gold fingers are provided on the two side region of the flexible board, and electrically connected to the flexible board, and the upper magnetic coils and the lower magnetic coils are configured around the middle hole in the middle region. Specifically, the upper magnetic coils are connected to the gold fingers.

The connection pads are configured in the middle region of the flexible board and close to the middle hole, and penetrate the dielectric layer to connect the upper magnetic coils and the lower magnetic coils. That is, the gold fingers, the upper magnetic coils, the connection pads and the lower magnetic coils are electrically connected.

The flexible board of the carrier board structure has two fold lines provided at the lower surfaces of the connections of the middle region and the two side regions, respectively. The fold line has a groove shape so as to help the side region to fold upwards or downwards. In particular, the dielectric layer embedded in the flexible board is broken at the fold lines due to the groove shape. That is, the dielectric layer in the middle region and the dielectric layer in the side region are not physically connected. As a result, the two side regions can fold easily.

The present invention may further comprise a covering layer, which covers the upper and lower surfaces of the flexible board, and is formed of an electrical insulation material with transparency or opaqueness.

Therefore, the present invention is provided with the upper magnetic coils and the lower magnetic coils close to the upper and lower surfaces of the flexible board, respectively, so as to greatly enhance magnetic induction effect with strictly limited area. Particularly, the two fold lines provided on the flexible board help the two side regions easily fold upwards or downwards without damage to the upper magnetic coils and the lower magnetic coils embedded in the flexible board thereby improving workability and reliability in the subsequent processes for the carrier board.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENT

The present invention may be embodied in various forms and the details of the preferred embodiments of the present invention will be described in the subsequent content with reference to the accompanying drawings. The drawings (not to scale) show and depict only the preferred embodiments of the invention and shall not be considered as limitations to the scope of the present invention. Modifications of the shape of the present invention shall too be considered to be within the spirit of the present invention.

Figure 1:
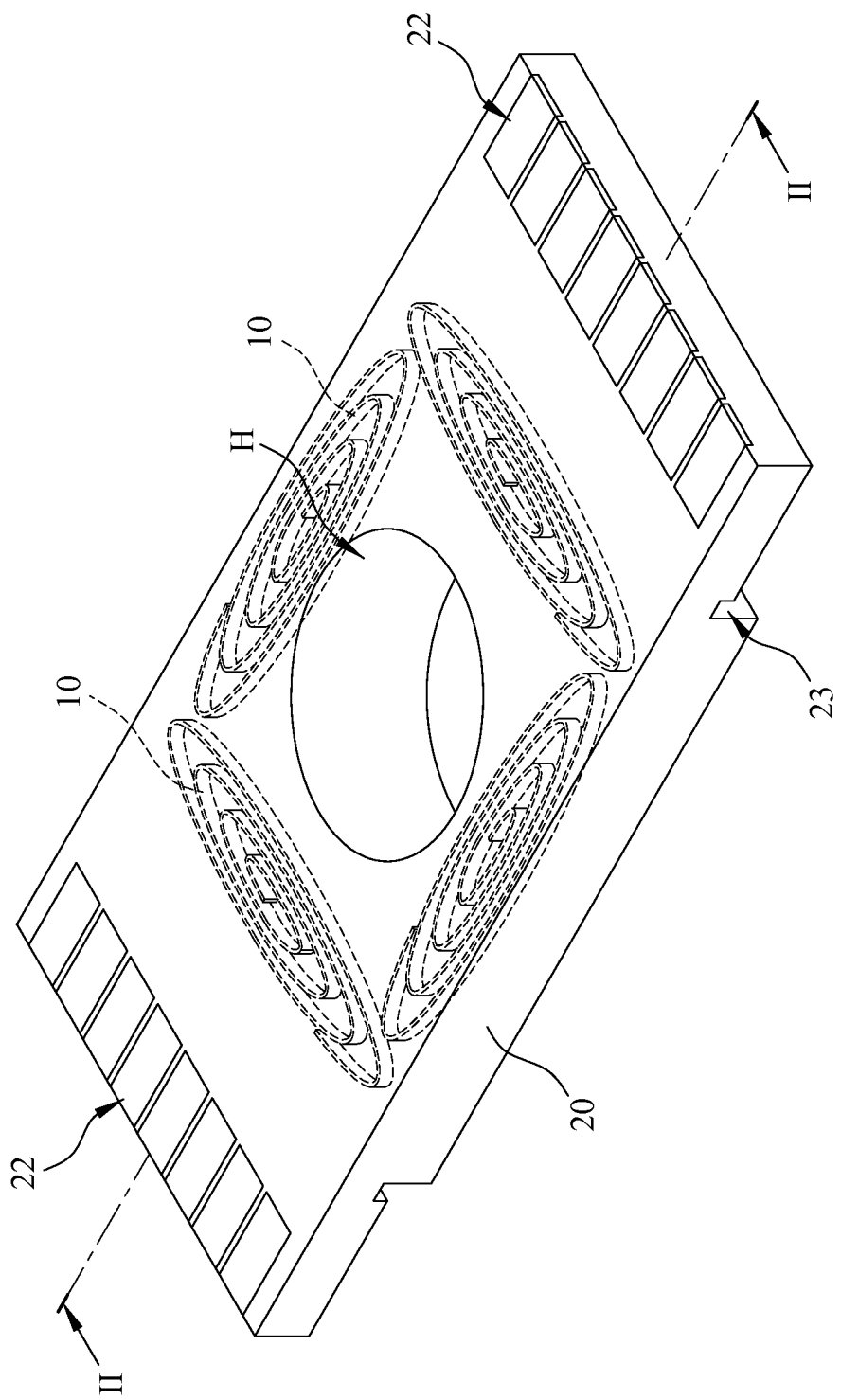
FIG. 1 is a perspective view showing a carrier board structure according to the first embodiment of the present invention.
Figure 2:
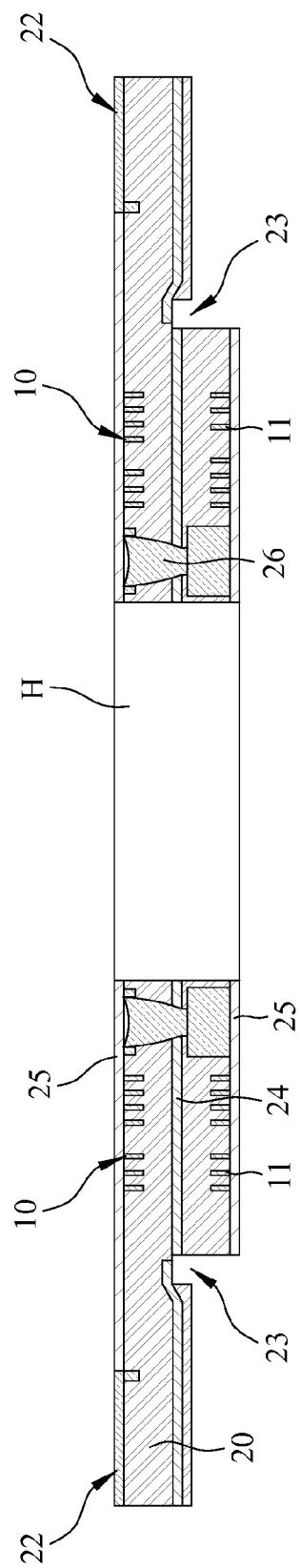
FIG. 2 is a cross sectional view showing the carrier board structure of the present invention in FIG. 1.

Please refer to FIGS. 1 and 2. FIG. 1 is a perspective view showing a carrier board structure according to the first embodiment of the present invention, and FIG. 2 is a cross sectional view showing the carrier board structure of the present invention in FIG. 1. As shown in FIGS. 1 and 2, the carrier board structure of the present invention is foldable and applicable to the field of magnetic induction, and generally comprises at least one upper magnetic coil 10, at least one lower magnetic coil 11, a flexible board 20, at least one gold finger 22, a dielectric layer 24 and at least one connection pad 26.

Specifically, the flexible board 20 has a middle region and two side regions bordering the middle region. Each side region is thinner than the middle region, and the middle region is bulgy downwards. The upper surface of the middle region and the upper surfaces of the two side regions form a co-plane. In other words, the upper surface of the flexible board 20 is smooth. A middle hole H is formed in the middle region.

The upper magnetic coils 10 and the lower magnetic coils 11 are embedded in the flexible board 20, each having a spiral shape. The upper magnetic coils 10 are close to the upper surface of the flexible board 20, and the lower magnetic coils 11 are close to the lower surface of the flexible board 20. The upper magnetic coils 10 and the lower magnetic coils 11 are configured around the middle hole H, and separated by the dielectric layer 24 embedded in the flexible board 20. In addition, the dielectric layer 24 is provided in the middle region and penetrated through by the middle hole H.

Moreover, the connection pads 26 are configured in the middle region of the flexible board 20, and close to the middle hole H, and penetrate the dielectric layer 24 to connect the upper magnetic coils 10 and the lower magnetic coils 11. That is, the upper magnetic coils 10 and the lower magnetic coils 11 are electrically connected via the connection pads 26.

The gold fingers 22 are provided on the two side region of the flexible board 20, and electrically connected to the upper magnetic coils 10. Thus, the gold fingers 22, the upper magnetic coils 10, the connection pads 26 and the lower magnetic coils 11 according to the present invention are electrically connected.

In particular, two fold lines 23 are specifically provided on the lower surface of the flexible board 20 and at the lower surfaces of the connections of the middle region and the two side regions, respectively. The fold line 23 has a groove shape depressed upwards so as to help the side region to fold upwards or downwards. In addition, the dielectric layer 24 embedded in the flexible board 20 is broken at the fold lines 23 due to the groove shape such that the dielectric layer 24 in the middle region and the dielectric layer 24 in the side region are not physically connected. In other words, the dielectric layer 24 does not continuously expand across the whole flexible bard 20, but are broken at the two fold lines 23.

Preferably, the upper magnetic coils 10, the lower magnetic coils 11, the gold fingers 22 and the connection pads 26 are formed of the same or different conductive materials like metal copper, copper alloy or gold, and the flexible board 20 is formed of a flexible and electrical insulation material such as resin or plastic material. Additionally, the dielectric layer 24 is formed of a dielectric material.

The present invention may further comprise a covering layer 25, which covers the upper and lower surfaces of the flexible board 20, and is formed of an electrical insulation material with transparency or opaqueness.

From the above mention, one primary feature of the present invention is that the upper magnetic coils, the lower magnetic coils and the flexible board are integrated and provided in the same carrier board so as to avoid the problem of less preciseness for alignment of respective holes in the prior arts, in which the coils and the flexible board are previously prepared, respectively, and then attached together. In particular, the upper magnetic coils and the lower magnetic coils of the present invention are configured close to the upper and lower surfaces of the flexible board, respectively, and connected via the connection pads so as to greatly enhance magnetic induction effect with strictly limited area.

Another feature of the present invention is that the fold lines provided on the flexible board help the two side regions easily fold upwards or downwards without damage to the upper magnetic coils and the lower magnetic coils embedded in the flexible board. Thus, the carrier board can suitably fold to fit any complex geographic structure in actual applications, thereby improving workability and reliability in the subsequent processes for the carrier board. Furthermore, the carrier board structure of the present invention possesses advantages in manufacturing cost so as to greatly increase industrial utility the current market.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A carrier board structure providing a coil induction function, comprising:
   a flexible board having a middle region and two side regions bordering the middle region, the middle region thicker than the two side regions and bulgy downwards, an upper surface of the flexible board being smooth, the middle region provided with a middle hole;
   at least one upper magnetic coil embedded in the flexible board, close to the upper surface of the flexible board, and having a spiral shape;
   at least one lower magnetic coil embedded in the flexible board, close to the lower surface of the flexible board, and having a spiral shape;
   a dielectric layer embedded in the flexible board, penetrated through by the middle hole, and separating the upper magnetic coils and the lower magnetic coils;
   at least one connection pad configured in the middle region of the flexible board, close to the middle hole, and penetrating the dielectric layer to connect the upper magnetic coils and the lower magnetic coils; and
   at least one gold finger provided on the two side region of the flexible board and electrically connected to the upper magnetic coils,
   wherein the upper magnetic coils and the lower magnetic coils are around the middle hole, the gold finger, the upper magnetic coils, the connection pads and the lower magnetic coils are electrically connected, two fold lines are provided on the lower surfaces of the flexible board and at connections of the middle region and the two side regions, respectively, the fold line has a groove shape depressed upwards so as to help the side region to fold upwards or downwards, and the dielectric layer embedded in the flexible board is broken at the fold lines due to the groove shape such that the dielectric layer in the middle region and the dielectric layer in the side region are not physically connected.

2. The carrier board structure as claimed in claim 1, wherein the upper magnetic coils, the lower magnetic coils, the gold fingers and the connection pads are formed of the same or different conductive materials, the flexible board is formed of a flexible and electrical insulation material, and the dielectric layer is formed of a dielectric material.

3. The carrier board structure as claimed in claim 1, further comprising a covering layer, which covers the upper and lower surfaces of the flexible board.

4. The carrier board structure as claimed in claim 3, wherein the covering layer is formed of an electrical insulation material with transparency or opaqueness.

* * * * *